(12) United States Patent
Costa et al.

(10) Patent No.: US 9,911,836 B2
(45) Date of Patent: Mar. 6, 2018

(54) VERTICAL BALLAST TECHNOLOGY FOR POWER HBT DEVICE

(75) Inventors: Julio Costa, Oak Ridge, NC (US); Michael Carroll, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 24 days.

(21) Appl. No.: 13/405,481

(22) Filed: Feb. 27, 2012

(65) Prior Publication Data

US 2012/0218047 A1 Aug. 30, 2012

Related U.S. Application Data

(60) Provisional application No. 61/446,745, filed on Feb. 25, 2011.

(51) Int. Cl.
| | |
|---|---|
| *H01L 29/732* | (2006.01) |
| *H01L 29/737* | (2006.01) |
| *H01L 23/66* | (2006.01) |
| *H01L 29/06* | (2006.01) |

(52) U.S. Cl.
CPC .......... *H01L 29/7325* (2013.01); *H01L 23/66* (2013.01); *H01L 29/7371* (2013.01); *H01L 29/0692* (2013.01); *H01L 2223/6644* (2013.01); *H01L 2224/131* (2013.01); *H01L 2224/13022* (2013.01); *H01L 2224/13147* (2013.01); *H01L 2224/16113* (2013.01); *H01L 2224/16225* (2013.01); *H01L 2224/16227* (2013.01); *H01L 2924/01037* (2013.01); *H01L 2924/1305* (2013.01)

(58) Field of Classification Search
CPC ............. H01L 21/8222; H01L 21/8248; H01L 21/8249; H01L 27/0259; H01L 27/0623; H01L 27/0635; H01L 27/0647–27/067; H01L 27/0711–27/0722; H01L 27/075–27/0783; H01L 27/082–27/0828; H01L 27/1022–27/1026; H01L 27/11801; H01L 27/11
See application file for complete search history.

(56) References Cited

U.S. PATENT DOCUMENTS

| | | | |
|---|---|---|---|
| 5,374,844 A | * | 12/1994 | Moyer .......................... 257/582 |
| 5,612,656 A | | 3/1997 | Sakamoto et al. |
| 6,229,329 B1 | | 5/2001 | Nakata et al. |
| 6,370,013 B1 | | 4/2002 | Iino et al. |

(Continued)

OTHER PUBLICATIONS

Non-Final Office Action for U.S. Appl. No. 13/447,828, dated Jun. 18, 2014, 15 pages.

(Continued)

*Primary Examiner* — Tucker J Wright
(74) *Attorney, Agent, or Firm* — Withrow & Terranova, P.L.L.C.

(57) ABSTRACT

Power amplification devices are disclosed having a vertical ballast configuration to prevent thermal runaway in at least one stack of bipolar transistors formed on a semiconductor substrate. To provide a negative feedback to prevent thermal runaway in the bipolar transistors, a conductive layer is formed over and coupled to the stack. A resistivity of the conductive layer provides an effective resistance that prevents thermal runaway in the bipolar transistors. The vertical placement of the conductive layer allows for vertical heat dissipation and thus provides ballasting without concentrating heat.

24 Claims, 17 Drawing Sheets

(56) References Cited

U.S. PATENT DOCUMENTS

| | | |
|---|---|---|
| 7,459,761 B2 * | 12/2008 | Lin .................. 257/528 |
| 2002/0103563 A1 | 8/2002 | Izawa et al. |
| 2002/0105577 A1 | 8/2002 | Nikawa |
| 2002/0106820 A1 | 8/2002 | Nikawa |
| 2004/0155666 A1 | 8/2004 | Kesil et al. |
| 2006/0023902 A1 | 2/2006 | Thigpen |
| 2007/0090854 A1 | 4/2007 | Hanaoka |
| 2007/0181976 A1 * | 8/2007 | Toyoda .................. 257/565 |
| 2008/0054261 A1 | 3/2008 | Song et al. |
| 2008/0061812 A1 | 3/2008 | McElfresh et al. |
| 2008/0105964 A1 | 5/2008 | Iwamura et al. |
| 2008/0150082 A1 * | 6/2008 | Zupac et al. .................. 257/565 |
| 2008/0204037 A1 | 8/2008 | Fukami |
| 2009/0249611 A1 | 10/2009 | Hanhikorpi et al. |
| 2009/0253239 A1 * | 10/2009 | Coolbaugh et al. .......... 438/330 |
| 2009/0261922 A1 | 10/2009 | Umeda |
| 2009/0283861 A1 * | 11/2009 | Takahashi ..................... 257/545 |
| 2011/0006784 A1 | 1/2011 | Yamaguchi et al. |
| 2014/0176165 A1 | 6/2014 | Wang et al. |

OTHER PUBLICATIONS

Final Office Action for U.S. Appl. No. 13/447,828, dated Jan. 2, 2015, 16 pages.
Advisory Action for U.S. Appl. No. 13/447,828, dated May 8, 2015, 3 pages.
Non-Final Office Action for U.S. Appl. No. 13/447,828, dated Sep. 2, 2015, 13 pages.
Final Office Action for U.S. Appl. No. 13/447,828, dated Mar. 9, 2016, 14 pages.
Advisory Action for U.S. Appl. No. 13/447,828, dated Jun. 23, 2016, 3 pages.
Non-Final Office Action for U.S. Appl. No. 13/447,828, dated Mar. 2, 2017, 13 pages.
Notice of Allowance for U.S. Appl. No. 13/447,828, dated Sep. 14, 2017, 7 pages.

* cited by examiner

VERTICAL BALLAST TECHNOLOGY FOR POWER HBT DEVICE

RELATED APPLICATIONS

This application claims the benefit of provisional patent application Ser. No. 61/446,745, filed Feb. 25, 2011, the disclosure of which is hereby incorporated herein by reference in its entirety.

FIELD OF THE DISCLOSURE

This disclosure relates to power amplification devices that utilize one or more stacks of bipolar transistors to amplify a radio frequency input signal.

BACKGROUND

Bipolar transistors, and in particular heterojunction bipolar transistors, (HBTs), have become the components of choice in power amplification applications that amplify radio frequency (RF) signals. These bipolar transistors, such as HBTs are typically built using either silicon (Si) and/or III-V semiconductor technologies. HBTs exhibit good response characteristics for both low-power and high-power applications. Furthermore, HBTs have also demonstrated great potential over a wide range of operating frequencies. Bipolar transistors, and in particular HBTs, are also strong candidates to meet the requirements of cellular handsets as well as 802.11a and 802.11b WLAN standards which power amplification of RF signals between 2.4 GHz and 5.8 GHz or greater.

HBTs may be arranged in stacks, often referred to as transistor cells, in order to amplify a RF input signal. Many power amplification devices have multiple transistor cells that are operably associated with one another in order to provide power amplification. The advantages of bipolar transistors, and in particular HBTs, have made these arrangements a popular choice for power amplification devices associated with RF transceivers. Unfortunately, one of the fundamental concerns when utilizing a stack of bipolar transistors is the prevention of thermal runaway. Thermal runaway is often caused by what may be referred to as current hogging by one or more transistors in the transistor cell. If one of the bipolar transistors (or even a small region of one of the bipolar transistors) in the stack runs even slightly hotter than the other transistors, the current in the slightly hotter bipolar transistor will locally increase. In turn, this causes the slightly hotter bipolar transistor to run even hotter than the other bipolar transistors thereby further increasing the current hogging of the slightly hotter bipolar transistor. This positive feedback thermal effect may continue until the hotter bipolar transistor or transistor region is destroyed. For example, metal regions used to form the contacts of the bipolar transistors can be melted away as a result of the excessive temperatures resulting from thermal runaway. Consequently, the transistor cell may no longer be capable of operating and sometimes the entire multi-cell power amplification device may no longer be capable of operating due to the failure of the single (or multiple) bipolar transistor(s). To prevent thermal runaway, a ballasted resistance is often coupled to the base of the bipolar transistors, the emitters of the bipolar transistors, or both to the base and the emitters of the bipolar transistors. This provides the necessary negative feedback to prevent slightly hotter bipolar transistors from current hogging.

Another important aspect of designing a reliable RF power amplification device is the management of the heat dissipation from the transistor cells during normal operation. Since the conversion of DC to RF power in an power amplification device can vary by approximately 10 to 70%, a large amount of DC power ends up being converted into heat. This heat needs to be efficiently dissipated. Otherwise, the semiconductor substrate may be heated outside a temperature range for reliable operation. Additionally, the heat may cause damage to the components of the power amplification device, such as the metallic regions used to form the contacts of the bipolar transistors.

To mount the power amplification device in an integrated circuit (IC) package assembly, a conventional mounting application mounts a backside of the power amplification device to a large metal region in a board containing a thermal heat sink for the power amplification device. The conventional approach works well with ballast resistors, as the heat generated locally by the bipolar transistors is dissipated through the backside of the power amplification device and through the heat sink of the board. While the conventional approach does a fairly good job of dissipating heat, conventional mounting applications also typically involve wire bonding in order to form the connections to the power amplification device. The stray inductances and mutual inductances created between the wires of wire bonded power amplification devices can cause significant cross talk and signal isolation problems. Accordingly, other mounting techniques such as different bump technologies and copper pillar technologies can be used to mount the power amplification devices on an IC package assembly. These mounting technologies provide better isolation for the connections to the power amplification device.

Unfortunately, the dissipation of heat generated from the bipolar transistors is complicated by these types of mounting technologies. For example, when the power amplification device is mounted using a bumped die technology, the semiconductor substrate of the power amplification device is typically upside-down and thus may not face the heat spreader region. In this case, the heat dissipation of the power cells is now very different from the conventional application, as the heat flow now needs to dissipate vertically from the semiconductor substrate through the solder bumps and, ultimately to the board. A problem therefore arises when the power amplification device needs to employ ballast resistors, such as emitter ballast resistors, and a mounting technology such as bumped die technology. In essence, the heat flow from the emitter region is strongly compromised as heat and electrical current must dissipate horizontally to reach the emitter ballast resistor. Only after this horizontal heat dissipation through the emitter ballast resistor can the heat then flow vertically and be collected by the solder bumps. This added lateral heat flow is very inefficient, as the lateral thermal resistance is fairly high and will cause a significant increase in the operating temperature of the bipolar transistors, potentially creating very unsafe and unreliable operating conditions.

In addition, another problem resulting from using mounting technologies such as bump die technologies and copper pillar technologies is that the design for the ballast resistors is typically spatially inefficient. These resistors or resistances must often be provided by components that are horizontally distal to the transistor cell. These horizontally distal resistive components also need to be provided on a semiconductor substrate which may not be a good thermal conductor. As a result, not only do these horizontally distal resistive components cause heat dissipation inefficiencies where heat generated by the transistor cell is concentrated at the horizontally distal resistive components, but, also, these configurations for the ballast resistors results in the consumption of space.

Thus, what is needed is an arrangement for a power amplification device that allows the power amplification device to be mounted using bump technologies and copper pillar technologies while providing both better spatial efficiency and better heat dissipation.

SUMMARY

This disclosure relates generally to embodiments of a power amplification device and methods of manufacturing the same. To amplify a radio frequency (RF) input signal, at least one stack of bipolar transistors is formed on a semiconductor substrate. Each of the bipolar transistors is operable to provide amplification to the RF input signal so that an amplified RF output signal is generated by the power amplification device. To prevent thermal runaway in the bipolar transistors, a conductive layer is formed over and coupled to the stack of the bipolar transistors. The resistivity of the conductive layer provides an effective resistance that prevents thermal runaway in each of the bipolar transistors. Furthermore, the vertical position of the conductive layer allows for heat to be dissipated vertically through the power amplification device rather than concentrated horizontally. In this manner, heat can be dissipated more efficiently through the power amplification device while still preventing thermal runaway.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
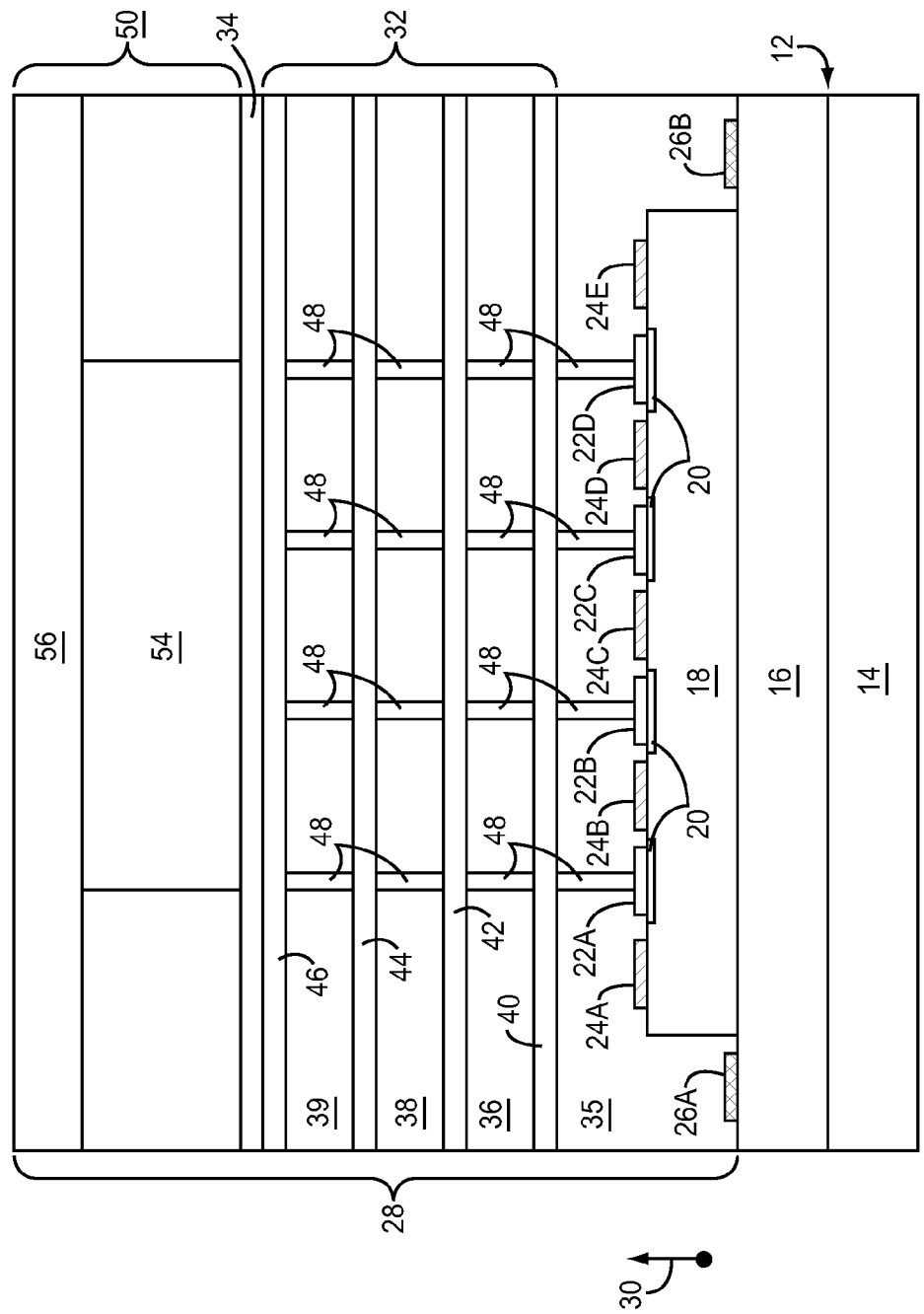
FIG. 1 illustrates a cross-sectional view of one embodiment of a power amplification device having a transistor cell in accordance with this disclosure.

FIG. 1 illustrates one embodiment of a power amplification device 10 operable to amplify a radio-frequency (RF) input signal. In this embodiment, the power amplification device 10 includes a semiconductor substrate 12. A stack of bipolar transistors is formed on the semiconductor substrate 12. The semiconductor substrate 12 includes a substrate layer 14, a collector layer 16, a base layer 18, and within the base layer 18 various emitter wells 20 with doped material to form emitters. Provided over each of the emitter wells 20 is an emitter contact (referred to generically as elements 22 and specifically as elements 22A-22D). Each of the emitter contacts 22 provide an emitter contact for one of a plurality of bipolar transistors, which in this case is four bipolar transistors. Also included on the semiconductor substrate 12 are base contacts (referred to generically as elements 24 and specifically as elements 24A-24E). Each of the base contacts 24A-24D serve as a base contact of one of the four bipolar transistors while the base contact 24E serves as a reference contact for the other four base contacts 24A-24D. The semiconductor substrate 12 also includes collector contacts (referred to generically as elements 26 and specifically as elements 26A-26B). The collector contact 26A serves as the collector contact for all four bipolar transistors while the collector contact 26B serves as a reference contact for the collector contact 26A. The bipolar transistors in FIG. 1 are thus configured as vertical bipolar transistors.

The semiconductor substrate 12 may be formed from any suitable semiconductor material such as Silicon (Si), Silicon Germanium (SiGe), Gallium Arsenide (GaAs), Indium Phosphorus (InP), and/or the like. The substrate layer 14 may be provided by a semiconductor die or a semiconductor wafer including various semiconductor dies that are formed from the above described semiconductor materials. The collector layer 16 may also be made from the above described materials except that the collector layer 16 is doped. A voltage may be provided from the collector contact 26A to the collector contact 26B which is the voltage that will be handled by the four bipolar transistors and thus by the transistor cell formed by the four bipolar transistors. The base layer 18 is also doped, in this case, in a manner antipodal from the doping of the collector layer 16. The emitter wells 20 are also filled with the semiconductor materials described above except doped in a manner similar to the collector layer 16 and antipodal to the doping of the base layer 18. Typical dopants that may be utilized to dope the collector layer 16, the base layer 18, and the emitter wells 20 are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. The bipolar transistors may be NPN devices or PNP devices depending on the requirements for a desired application. Furthermore, additional layers may be provided between or on top of the collector layer 16, the base layer 18, and the emitter wells 20, such as a sub-collector layer, epi-layers, insulating layers, and/or the like in accordance with the particular application for the bipolar transistors. CMOS or BiCMOS technology may be implemented to form the bipolar transistors.

In one embodiment, the bipolar transistors are configured as bipolar junction transistors (BJTs). Typically, however, heterojunction bipolar transistors (HBTs) are utilized in power amplification devices that amplify RF signals and the bipolar transistors may thus be HBTs. When the appropriate threshold voltage is provided between the base contacts 24A-24D and the emitter contacts 22A-22D, the four transistors are activated. The vertical arrangement of the bipolar transistors employ vertical current transport between the emitter wells 20 and the collector layer 16 in order to amplify the RF signal. Vertical current transport may be more spatially efficient and lead to higher power density. Also, this approach offers higher linearity at peak power levels, superior power added efficiency, and less noise which is advantageous for power amplification devices that amplify RF signals.

The power amplification device 10 shown in FIG. 1 further includes an insulating structure 28 that is formed over the semiconductor substrate 12 so as to insulate the stack of bipolar transistors. (It should be noted that the term "over" is discussed throughout this disclosure with reference to a direction 30 that is normal to a surface of semiconductor substrate 12 having the contacts 22, 24, and 26.) A first portion 32 of the insulating structure 28 shown in FIG. 1 includes a conductive layer 34 and various insulating layers 35, 36, 38, and 39. The insulating layers 35, 36, 38, and 39 may be formed from a dielectric material such as a Silicon Oxide ($SiO_x$). Also included in the first portion 32 of the insulating structure 28 are metallic layers 40, 42, 44, and 46. These metallic layers 40, 42, 44, and 46 may be made from a conductive material such as Gold (Au), Nickel (Ni), Copper (Cu), and/or the like. Coupled between the metallic layers 40, 42, 44, and 46 are conductive vias 48 that couple the first portion 32 to the emitter contacts 22A-22D. Furthermore, the conductive layer 34 is formed over the stack of the bipolar transistors on the semiconductor substrate 12 and within the insulating structure 28.

The conductive layer 34 is coupled by the conductive vias 48 to the stack of bipolar transistors. A resistivity of the conductive layer 34 provides an effective resistance that prevents thermal runaway in each of the bipolar transistors. Consequently, if there are variations in temperature between the bipolar transistors, the effective resistance of the conductive layer 34 provides the negative feedback required to counter the positive feedback thermal effect caused by variations in temperature between the bipolar transistors. Accordingly, the effective resistance of the conductive layer 34 prevents the stack of bipolar transistors from entering a chaotic thermal runaway condition, which may destroy the bipolar transistors due to temperature variations between a bipolar transistor and its neighbors.

As explained in further detail below, the vertical placement of the conductive layer 34 also allows for vertical heat dissipation and to provide a path to ground in an integrated circuit (IC) package assembly. Since the conductive layer 34 is coupled to the emitter contacts 22, the effective resistance of the conductive layer 34 basically provides an emitter ballast resistance that protects against thermal runaway. Other configurations may be employed to provide a base ballast resistance or both a base ballast resistance and an emitter ballast resistance. By positioning the conductive layer 34 in a vertical manner relative to the stack of bipolar transistors, not only are the bipolar resistors protected from thermal runaway but the configuration provides for better heat dissipation and thus increases the operating range of the stack of bipolar transistors.

The first portion 32 of the insulating structure 28 forms what is known as a Faraday cage over the bipolar transistors on the semiconductor substrate 12. The insulating layers 35, 36, 38, and 39 prevent or at least reduce the amount of internal and external electromagnetic radiation that can enter or exit the power amplification device 10. In FIG. 1, the conductive vias 48 are coupled to the emitter contacts 22A-22D in order to provide a path to ground. The conductive vias 48 are arranged in a cage-like structure which also acts as an isolator to protect the bipolar transistors from external noise. It should be noted that the particular embodiment shown in FIG. 1 has the conductive vias 48 coupled to the emitter contacts 22A-22D. However, this is simply for the cross section shown in FIG. 1, which illustrates each level of the Faraday cage as having four conductive vias 48. Other cross sections of the power amplification device 10 may include conductive vias 48 that are coupled to the base contacts 24 and the collector contacts 26 in order to provide the appropriate connections to ground. For example, in one embodiment, each level of the Faraday cage has eight sets of the four conductive vias 48 coupled to the collector contacts 26 at each level of the Faraday cage thereby providing for a total of thirty two conductive vias at each level of the Faraday cage.

In this embodiment, the conductive layer 34 is built into and provided within the insulating structure 28. The conductive layer 34 may be formed from any suitable conductive material that provides the appropriate resistivity so that the effective resistance of the conductive layer 34 prevents thermal runaway. A second portion 50 of the insulating structure 28 provides a cap that may be utilized in order to connect the power amplification device 10 to an IC package and provide a path to ground. The second portion 50 includes a dielectric layer 52 made from the same or similar materials as the insulating layers 34, 36, 38, and 39. The second portion 50 also includes a large via 54 that allows the emitter contacts 22 to all be coupled to ground. It should be noted that while only the large via 54 is shown in FIG. 1, other large conductive vias may be provided in the second portion 50 and coupled the different sets of conductive vias 48 on the different levels of the Faraday cage. In one embodiment, four large vias, like the large conductive via 54 are provided. The large conductive vias 54 is coupled to a thick metallic layer 56 which may generally be made of a material such as Copper (Cu).

Figure 2:
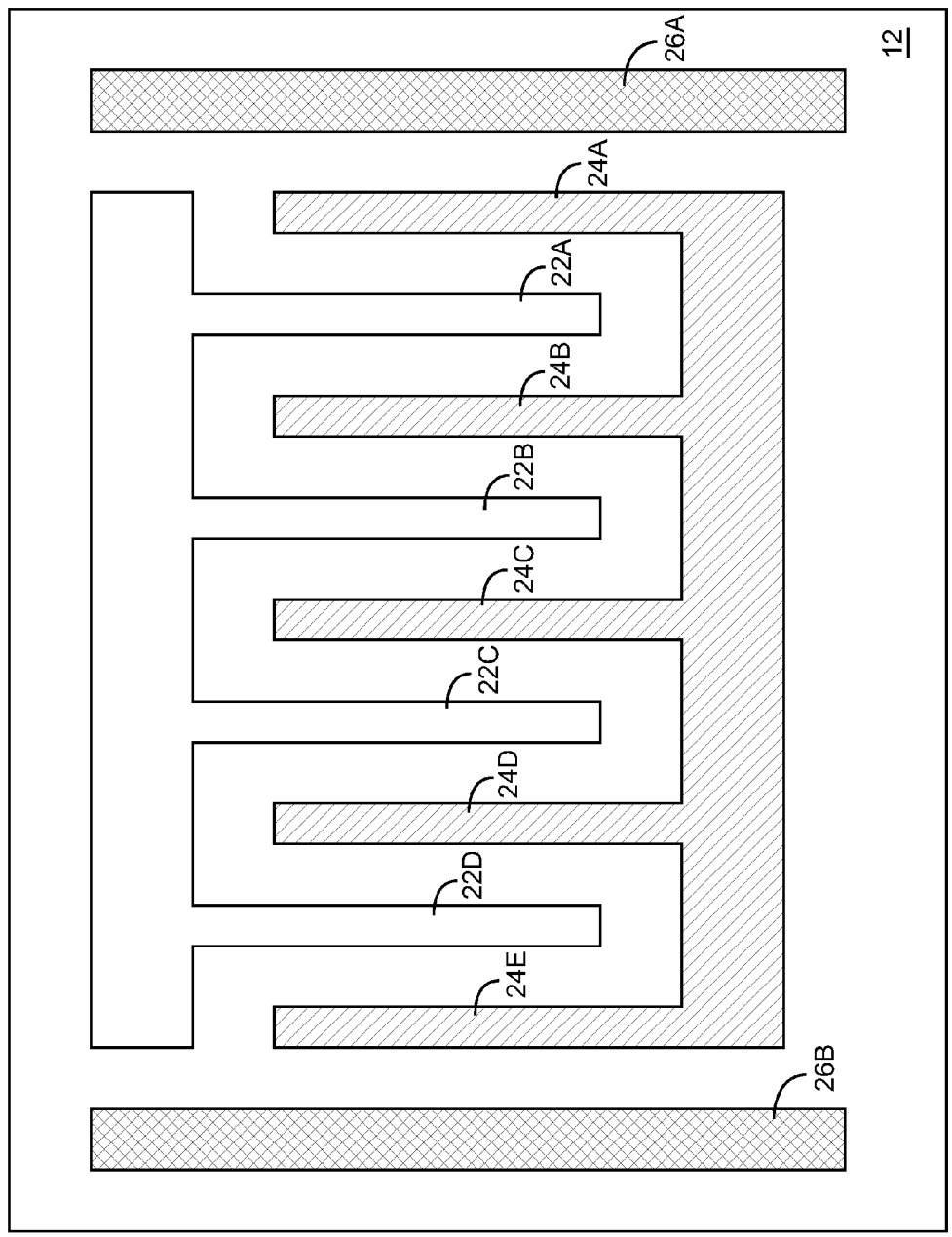
FIG. 2 is a top view of a semiconductor substrate that forms a stack of bipolar transistors in the transistor cell shown in FIG. 1.

FIG. 2 illustrates a top view of a semiconductor substrate 12 without the insulating structure 28 shown in FIG. 1. As illustrated in FIG. 2, the emitter contacts 22 and the base contacts 24 are provided by interweaved finger-like structures. The embodiment of the transistor cell shown in FIG. 2 includes the necessary number of fingers in order to form four bipolar transistors such as HBTs, and the collector contacts 26A and 26B are common to all four transistors. While the transistor cell shown in FIG. 1 includes four fingers, the transistor cell may have any number of transistors where the number of transistors is controlled by the number of emitter contacts 22 and base contacts 24 provided for a particular structure. Since the bipolar transistors shown in FIG. 2 are formed as vertical transistors as discussed above, more transistors may be added by interweaving additional fingers to form additional emitter contacts 22 and base contacts 24. Additional collector contacts 26 may not be required since the collector layer 16 shown in FIG. 1 is common to all of the bipolar transistors and defines the voltage to be handled by the transistor cell.

Figure 3:
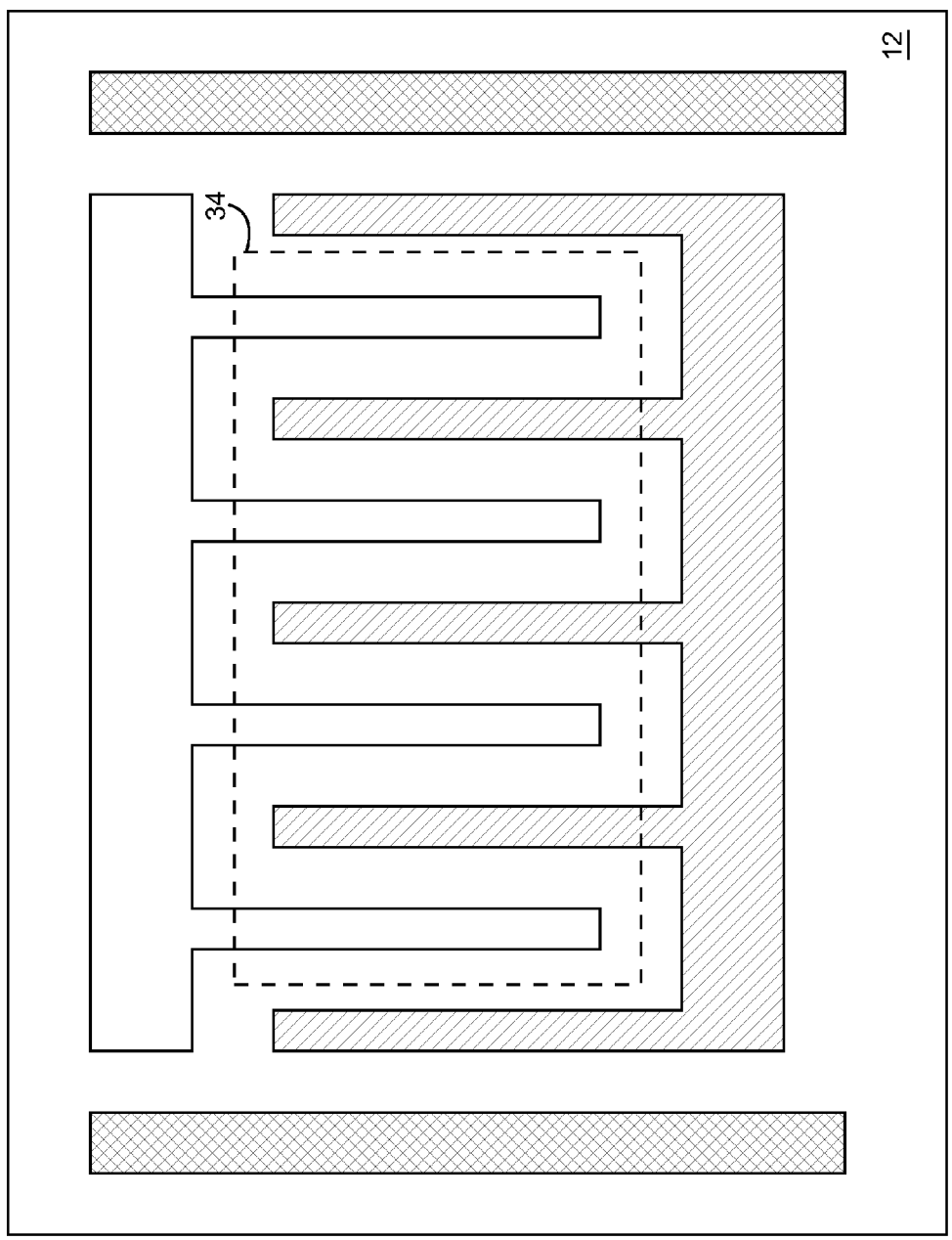
FIG. 3 is the semiconductor substrate shown in FIG. 2 illustrating the position of a conductive layer relative to the stack of bipolar transistors.

FIG. 3 illustrates the top view of the semiconductor substrate 12 shown in FIG. 2 along with a representation of the conductive layer 34 that is provided over the stack of bipolar transistors in the semiconductor substrate 12. Generally, the semiconductor substrate 12 has a thermal resistivity that does not allow for the appropriate dissipation of heat through the semiconductor material. Consequently, by positioning the conductive layer 34 over the stack of bipolar transistor on the semiconductor substrate 12, heat is allowed to dissipate vertically.

Figure 4:
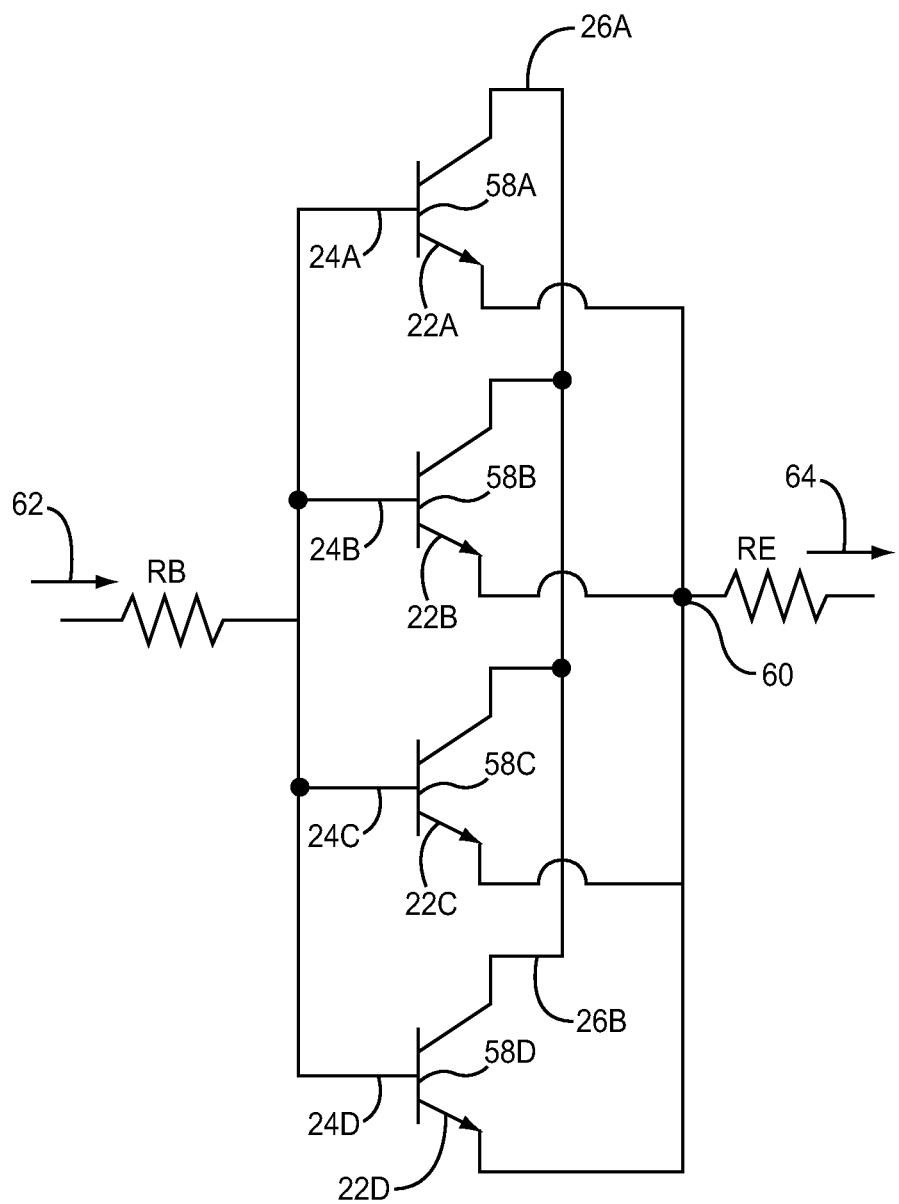
FIG. 4 is a circuit diagram for the transistor cell illustrated in FIG. 1.

FIG. 4 illustrates one embodiment of a circuit diagram of the stack of bipolar transistors (referred to generically as elements 58 and individually as elements 58A-58D). The bipolar transistors 58 are coupled in parallel and thus the emitter contacts 22 are each independently connected to a node 60. While each of the bipolar transistors 58 is shown as having an individual collector terminal, this may not be the case. As discussed above, the collectors may all be provided by a common collector layer 16 (shown in FIG. 1). Thus while the collector terminals of each of the bipolar transistors 58 are shown coupled to one another, this is simply a circuit diagram and bipolar transistors may employ vertical current transport so as to provide bipolar transistors that do not have individual collectors. Each of the bipolar transistors 58 is operable to provide amplification to an RF input signal 62. The RF input signal 62 is received through a base ballast resistor RB. The current of the RF input signal 62 is divided among the bipolar transistors 58 so that each of the bipolar transistors 58 provides amplification to the RF input signal 62. An amplified RF output signal 64 is then generated at node 60. As shown in FIG. 4, an emitter ballast resistance RE is provided to prevent thermal runaway. The emitter ballast resistance RE represents the effective resistance provided by the conductive layer 34 to prevent thermal runaway. It should be noted that while the embodiment shown in FIG. 4 amplifies the RF input signal 62 to generate the amplified RF output signal 64 from one transistor cell, any number of transistor cells may be provided to amplify the RF input signal 62. Thus, the signal received through the base ballast resistor RB may actually be just a portion of the RF input signal 62. Each of the bipolar transistors 58 is configured to provide amplification to the RF input signal as would be stacks of other bipolar transistors in other transistor cells. In embodiments having multiple transistor cells, each of the bipolar transistors in the various stacks of bipolar transistors will generate the amplified RF output signal 64 by the amplification provided as a whole.

Figure 5:
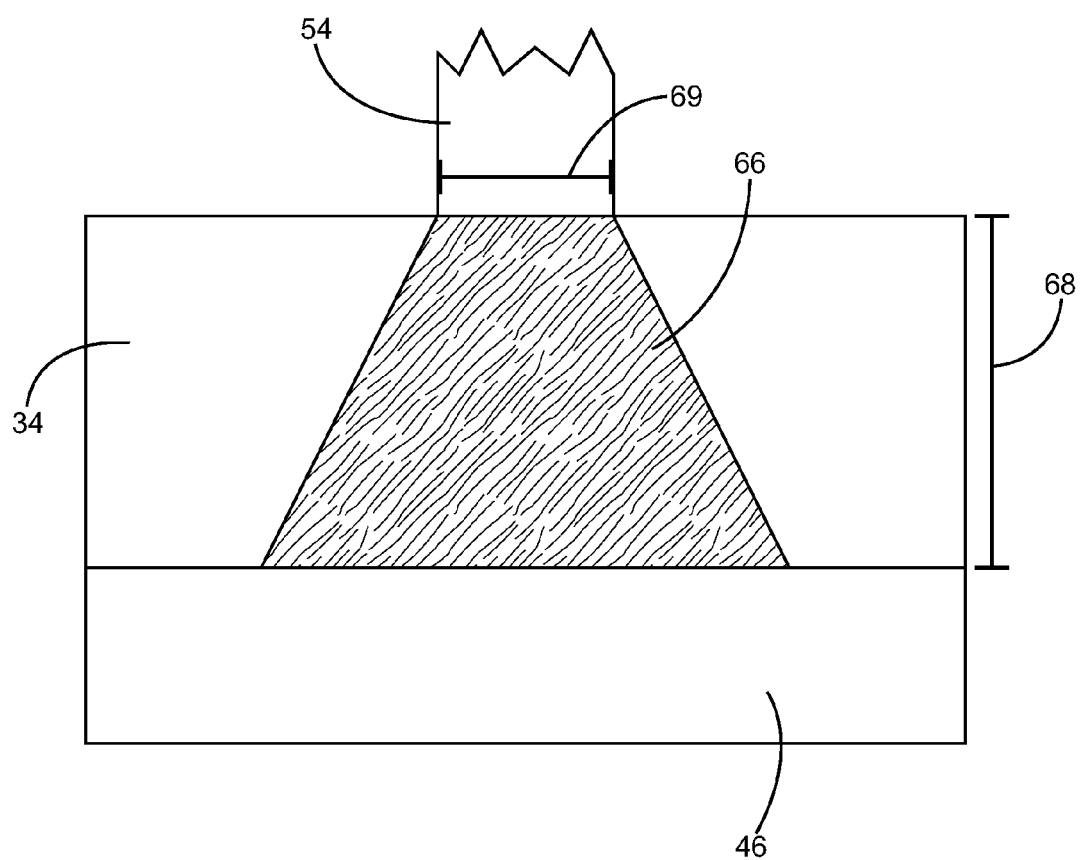
FIG. 5 is a cross-sectional view illustrating a resistive volume of the conductive layer in which a resistivity of the conductive layer provides an effective resistance.

FIG. 5 is a representation of the metallic layer 46, the conductive layer 34, and the conductive via 54 shown in FIG. 1. The pyramid shape within the conductive layer 34 represents a resistive volume 66 of the conductive layer 34 that provides the effective resistance of the conductive layer 34. It should be noted first that the resistive volume 66 is simply an estimation and furthermore simply an example of a resistive volume that may be provided by the conductive layer 34. The effective resistance provided by the conductive layer 34 can be a complex problem that is determined by the particular geometry of the components coupled to the conductive layer 34. It should be noted that while the conductive layer 34 in FIG. 1 is connected to the metallic layer 46, the conductive layer 34 may actually be inserted anywhere within the insulating structure 28. Thus, the conductive layer 34 could also be provided over the insulating structure 28 on the thick metallic layer 56, between the conductive via 54 and the thick metallic layer 56, between the conductive vias 48 and the metallic layer 46, between the conductive vias 48 and the metallic layer 44, between the conductive vias 48 and the metallic layer 42, between the conductive vias 48 and the metallic layer 40, or even directly onto the emitter contacts 22 provided that the emitters are configured appropriately.

Referring again to FIG. 5, the pyramid shape of the resistive volume 66 is the result of the resistance provided by the conductive layer 34 being spread between the conductive via 54 and the metallic layer 46. The approximation of the effective resistance is thus equal to the effective resistance provided by the resistive volume 66 which takes on approximately a three-dimensional pyramidal shape. In essence, the effective resistance provided by the resistive volume 66 is the parallel combination of the resistance defined under the conductive via 54 plus the parallel combination of the four wedges at the base of the resistive volume 66. The effective resistance of the resistive volume 66 can thus be approximated by the equation shown below:

$$R_E = \rho * \frac{t}{W*L} \| \frac{1}{4}\left(2*\rho*\frac{t}{W*L}\right)$$

ρ=resistivity of the conductive layer 34
t=a thickness 68 of the conductive layer 34
W=the width 69 of the conductive via 54
L=depth (not shown) of the conductive via 54

The approximation discussed above may be simplified to the equation shown below:

$$R_E = \frac{1}{2}*\rho*\frac{t}{W*L}$$

Consequently, the effective resistance provided for a single conductive via 54 can be approximated by the equation shown above. The approximation shown above demonstrates that the effective resistance is dependent on the resistivity ρ of the conductive layer 34, the thickness 68 of the conductive layer 34, the width 69 of the conductive via 54, and the depth (L) of the conductive layer 34.

Referring now to FIGS. 1 and 5, as discussed above, the conductive layer 34 may have a vertical position anywhere in the insulating structure 28. Thus, for example, if the conductive layer 34 were provided between the conductive vias 48 that are connected directly to the emitter contacts 22 and the metallic layer 40, the effective resistance provided by the conductive layer 34 may be approximated as the parallel combination of four resistive volumes at each of the conductive vias 48. As shown by the equation above, the resistance provided by the resistive volume at one via essentially is about half of the resistance of the via defined region due to the spreading of the resistance within the conductive layer 34. Thus, the expression for the effective resistance provided by the conductive layer is shown by the equation shown below:

$$R_E = \frac{1}{8} * \rho * \frac{t}{W*L}$$

In some embodiments of the power amplification device, there are multiple conductive vias connected to each emitter contact 22 at the various levels of the Faraday cage. For example, the conductive vias 48 may be divided into two conductive vias and there may be another set of these two conductive vias provided at another cross section making a total of thirty-two conductive vias coupled to the emitter contacts 22 at one of the levels of the Faraday cage. As a result, the effective resistance provided by the conductive layer 34 may be a parallel combination of thirty two of the resistive volumes. Thus, the effective resistance can be approximated by the equation shown below:

$$R_{Eballast} = \frac{1}{64} * \rho * \frac{t}{W*L}$$

Of course, the effective resistance will depend on the resistivity p of the conductive layer, the depth and width of each of the thirty two conductive vias, the thickness 68 of the conductive layer 34, and any other electrical, material, and/or geometrical characteristics that affects the effective resistance of the conductive layer. The effective resistance of the conductive layer 34 can thus be determined by selecting the appropriate material for the conductive layer 34 so that the conductive layer 34 provides a desired effective resistance. In one embodiment, the effective resistance provided by the conductive layer is approximately 2 Ohms. To provide this effective resistance of 2 Ohms, the appropriate material for the conductive layer 34 should be selected so that the resistivity of the conductive layer 34 provides the resistance of 2 Ohms given the geometrical constraints at the particular vertical position of the conductive layer 34 within the insulating structure 28.

Figure 6A:
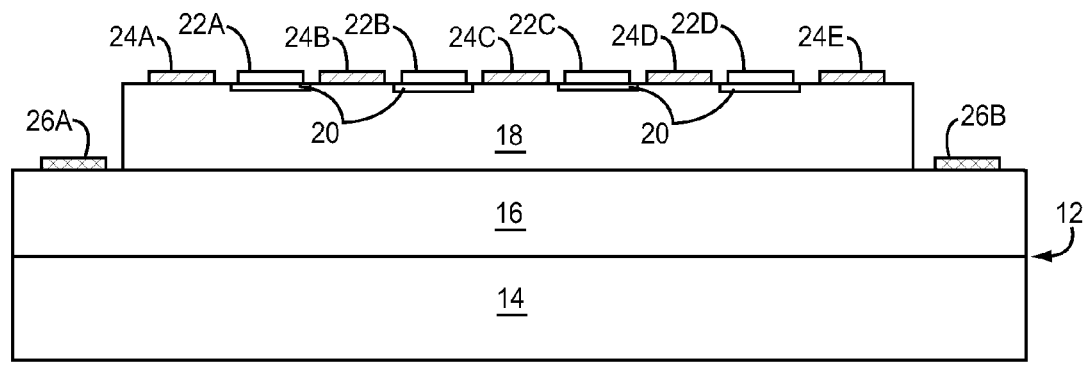
FIGS. 6A-6D illustrate exemplary procedures for forming the power amplification device shown in FIG. 1.

FIG. 6A-6D illustrates exemplary procedures for forming the power amplification device 10 shown in FIG. 1. To begin, the semiconductor substrate 12 is provided and a stack of bipolar transistors are formed on the semiconductor substrate 12 (FIG. 6A). The stack of bipolar transistors is operable to provide amplification to an RF input signal so that an amplified RF output signal is generated. The bipolar transistors may be formed on the semiconductor substrate 12 by providing the appropriate doping to the collector layer 16, the base layer 18, and the emitter wells 20. The fingered metallic portions and other metallic portions shown in FIG. 2 may also be provided on the semiconductor substrate 12 to form the emitter contacts 22, the base contacts 24, and the collector contacts 26 as discussed above.

Figure 6B:
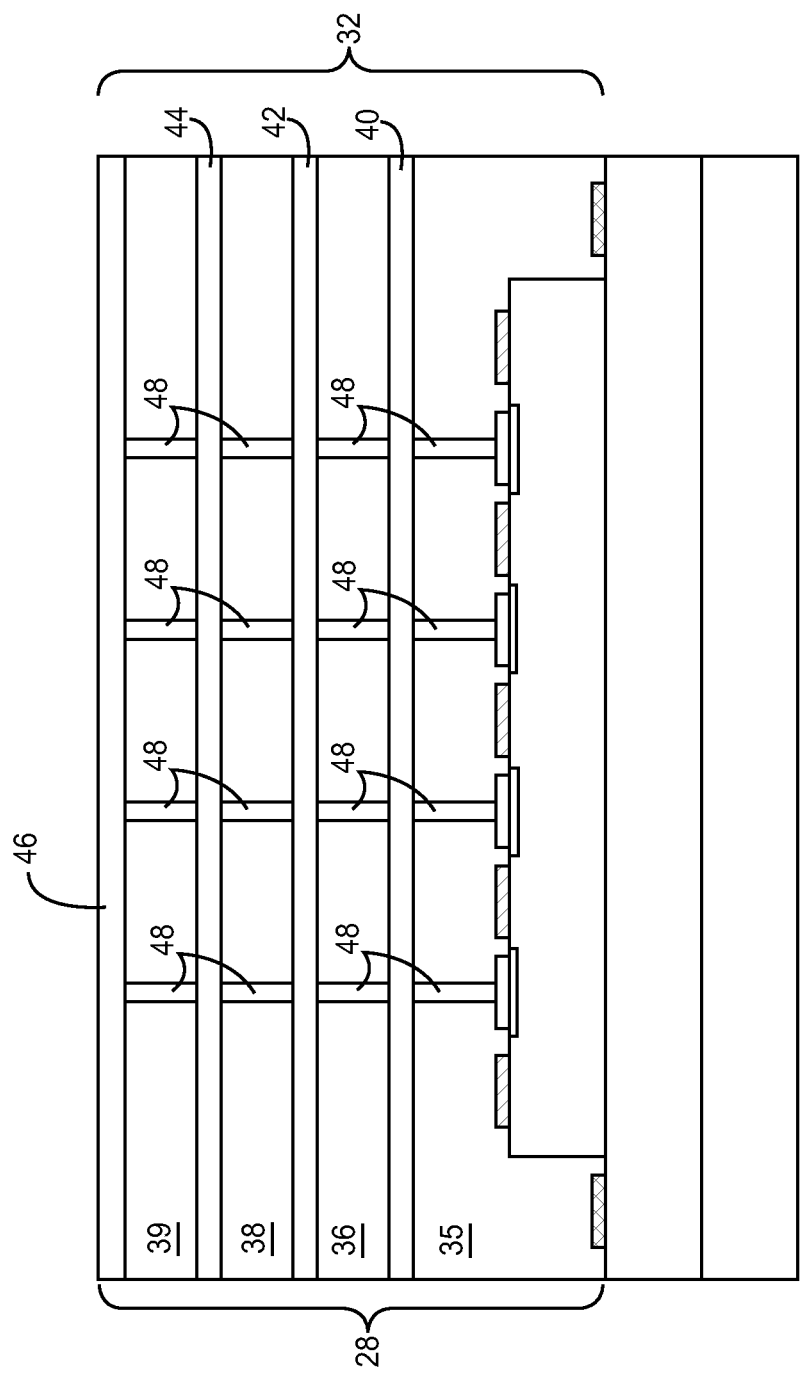

Next, the first portion 32 of the insulating structure 28 is formed over the stack of bipolar transistors on the semiconductor substrate 12 (FIG. 6B). In one embodiment, the insulating layer 35 is provided over the stack of bipolar transistors. Subsequently, the conductive vias 48 are formed within the insulating layer 35. Next, the metallic layer 40 is formed on the insulating layer 35 and the conductive vias 48. The insulating layers 36, 38, and 39, the metallic layers 42, 44, and 46, and the remainder of the conductive vias 48 are formed in the same manner.

Alternatively, the insulating layer 35 is provided and subsequently the metallic layer 40 is formed. After laying the metallic layer 40, the conductive vias 48 within the insulating layer 35 are formed. The insulating layers 36, 38, and 39, the metallic layers 42, 44, and 46, and the remainder of the conductive vias 48 may be formed in a similar manner.

Figure 6C:
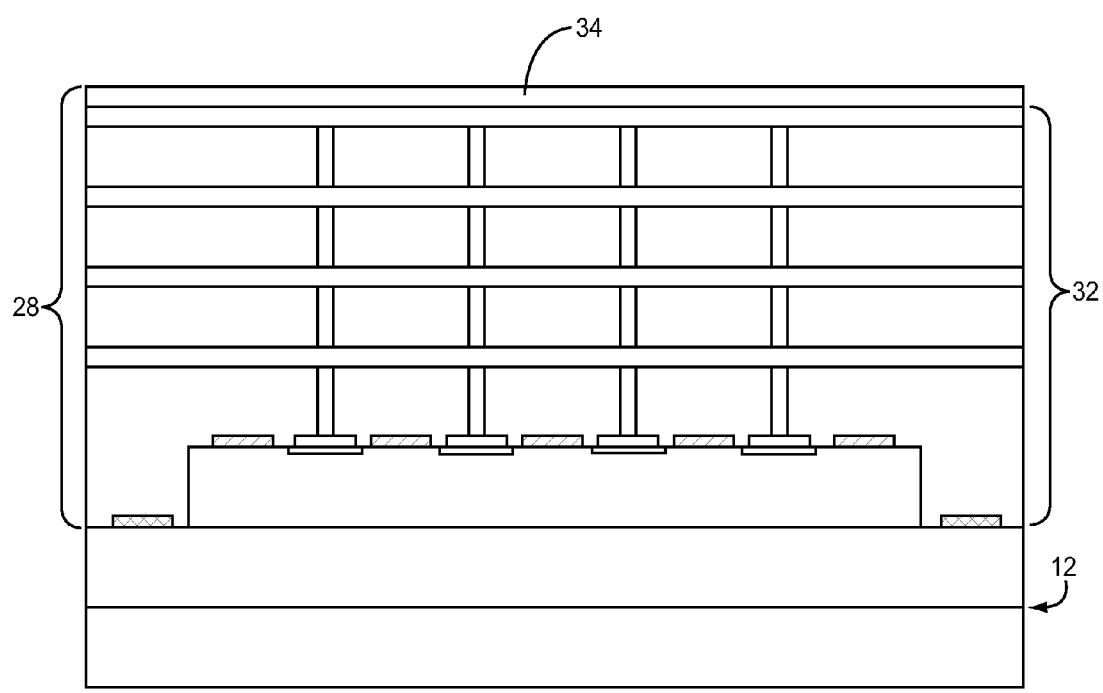
Figure 6D:
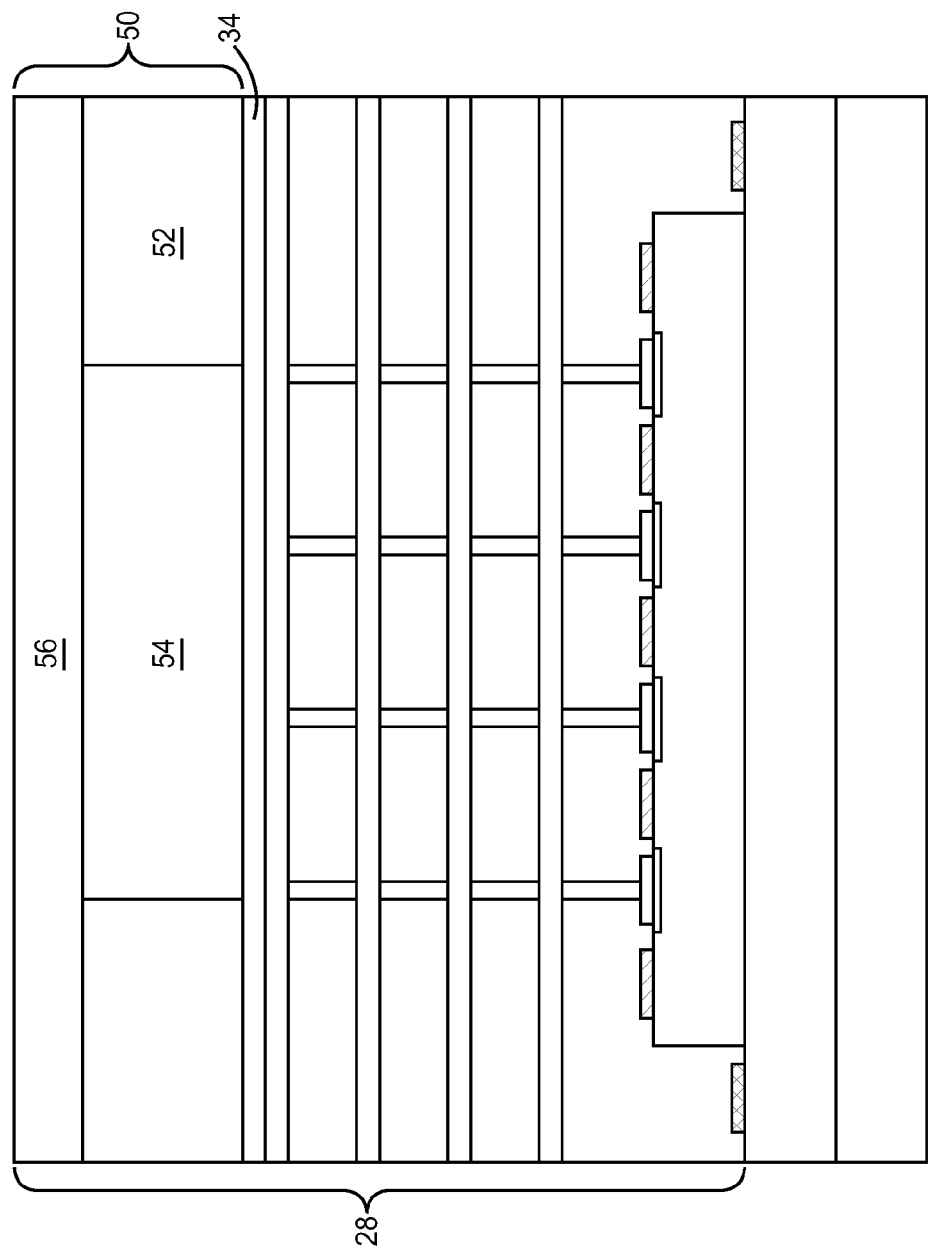

In the exemplary embodiment shown, the conductive layer 34 is then formed on the first portion 32 of the insulating structure 28 (FIG. 6C). The conductive layer 34 may be formed from any conductive material so as to provide the appropriate effective resistance. In one embodiment, the conductive layer 34 is a metallic layer. This metallic layer may be formed from Copper (Cu), Gold (Au), Nickel (Ni), Cobalt (Co), Silver (Ag), and/or any type of suitable metallic alloy that provides the appropriate resistivity in order to provide the desired effective resistance. In other embodiments, non-metallic or at least partially non-metallic conductive materials may be utilized to form the conductive layer 34. Subsequently, the second portion 50 of the insulating structure 28 is formed on the conductive layer 34 (FIG. 6D). To do this, the dielectric layer 52 may be provided on the conductive layer 34. Next, the conductive via 54 may be formed within the dielectric layer 52. The thick metallic layer 56 may then be formed on the dielectric layer 52 and the conductive via 54. Generally, the thickness and material of the thick metallic layer 56 is selected to allow for coupling through flip chip technology and/or copper pillar technology. Alternatively, the dielectric layer 52 may first be formed on the conductive layer 34. Then the thick metallic layer 56 may be formed on the dielectric layer 52. After the thick metallic layer 56 is formed on the dielectric layer 52, the conductive via 54 is provided. The width of the conductive via 54 is configured to provide a ground connection, as explained below, for the emitters formed on the semiconductor substrate 12. As shown by FIG. 6A-6D, the exemplary procedures provide an example in which the conductive layer 34 within the insulating structure 28 as the insulating structure 28 is formed over the semiconductor substrate 12. In this embodiment, the conductive layer 34 is positioned between the stack of bipolar transistors on the semiconductor substrate and the thick metallic layer 56.

Figure 7A:
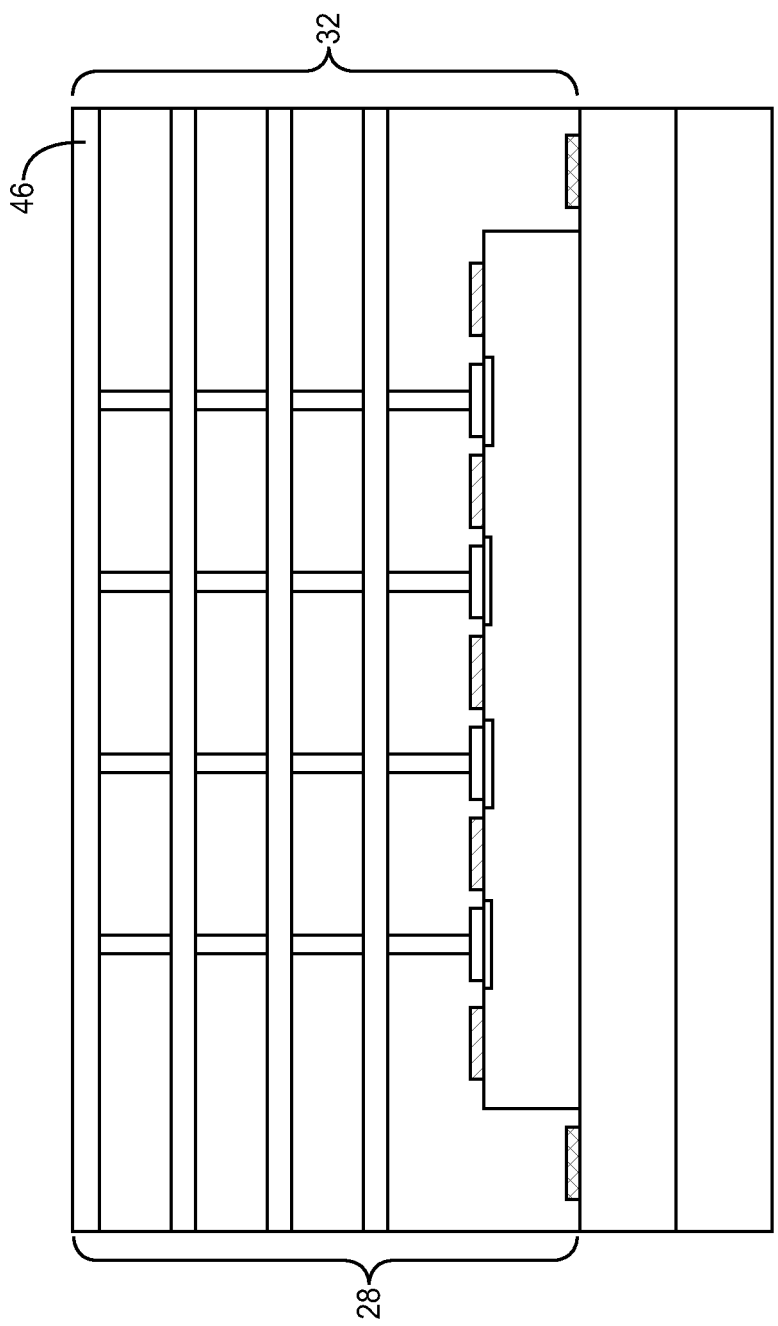
FIGS. 7A-7C illustrate exemplary procedures for forming another embodiment of a power amplification device.
Figure 7B:
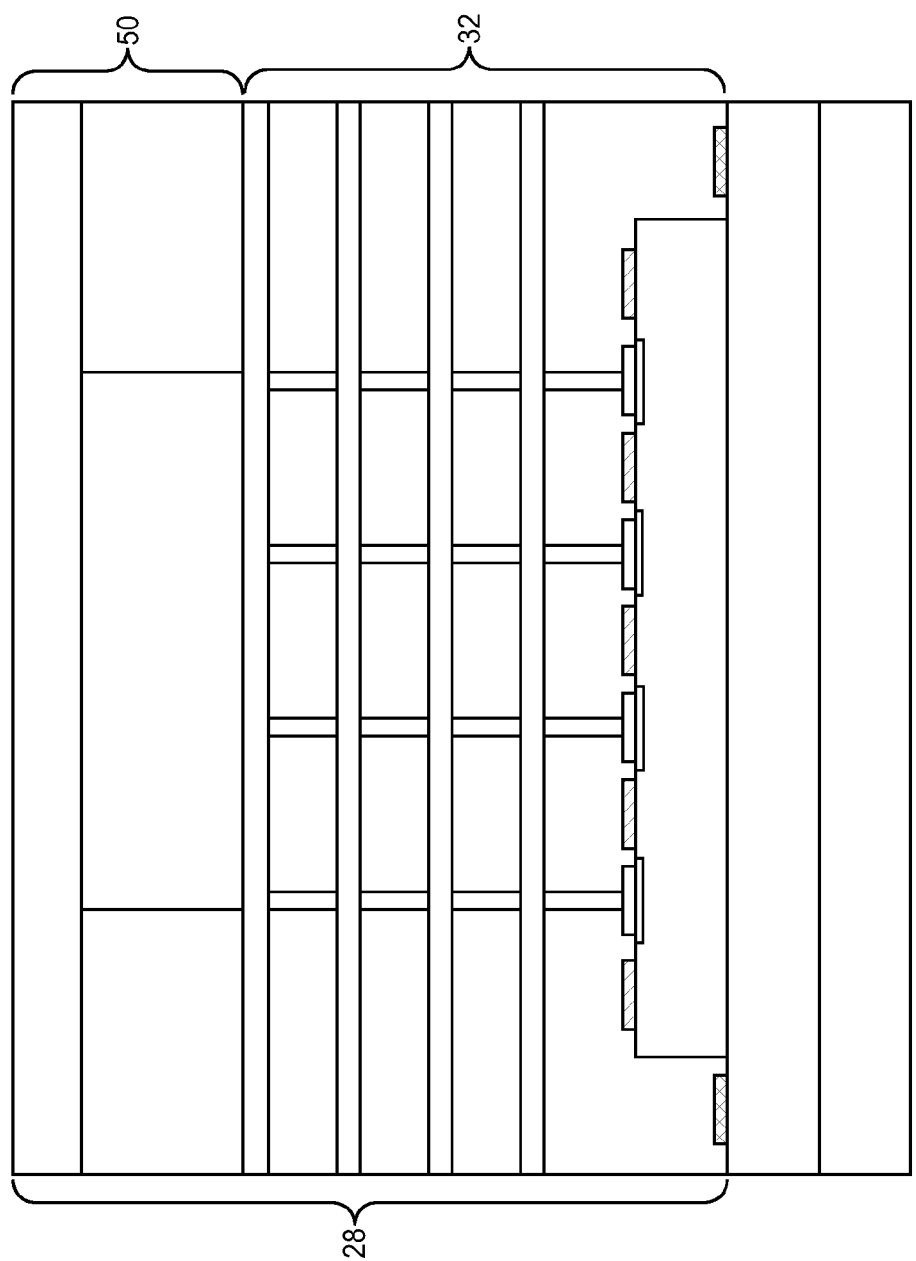
Figure 7C:
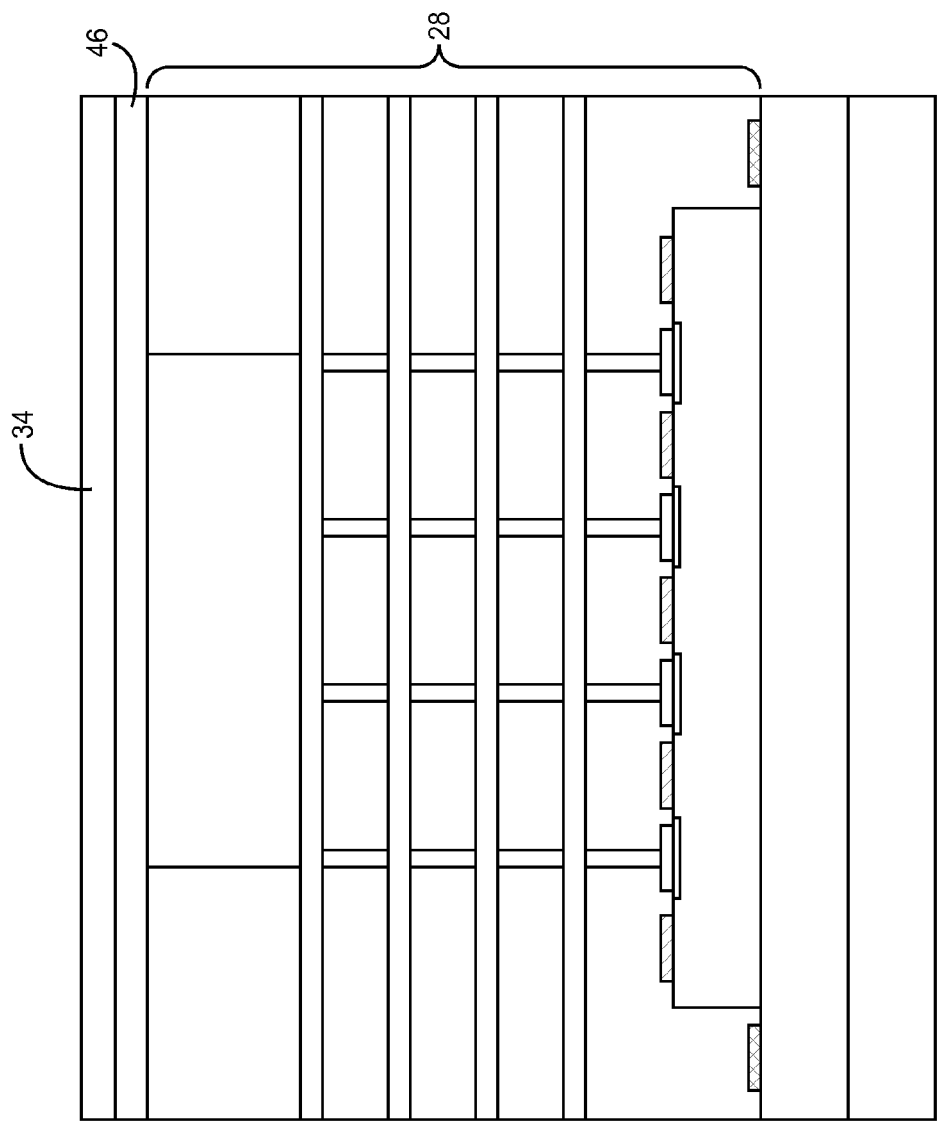

FIG. 7A-7C illustrates exemplary procedures for forming another embodiment of the power amplification device. FIG. 7A illustrates the device after the first portion 32 has been formed in the insulating structure 28. Thus, the procedures discussed for FIGS. 6A and 6B are analogous to procedures needed provide the structure shown in FIG. 7A. Next, the second portion 50 of the insulating structure 28 is formed on the first portion 32 (FIG. 7B). Finally, the conductive layer 34 is then provided over the insulating structure 28 (FIG. 7C). FIGS. 7A-7C thus illustrates exemplary procedures where the conductive layer 34 is provided over the insulating structure 28.

Figure 8:
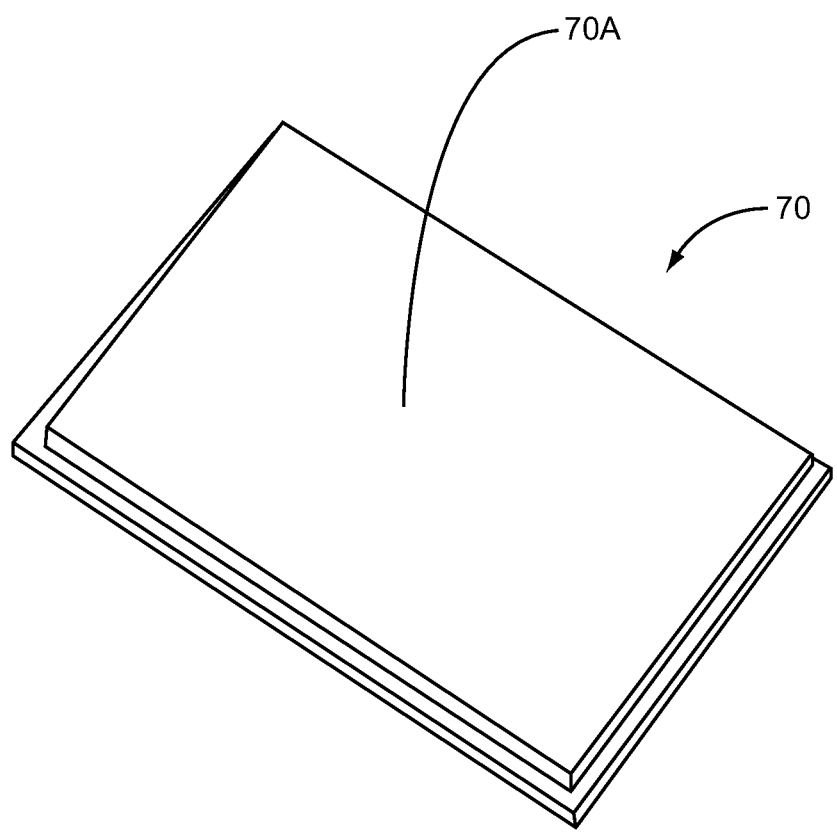
FIG. 8 illustrates one embodiment of an integrated circuit (IC) package assembly that houses the power amplification device shown in FIG. 1.

Referring now to FIG. 8, FIG. 8 illustrates one embodiment of an IC package assembly 70. The IC package assembly 70 includes an IC package 70A which may be made from a ceramic or plastic and prevents physical damage and corrosion to integrated circuits housed within the IC package 70A. The IC package assembly 70 also supports the electric contacts of the IC circuits housed within the IC package 70A. This embodiment of the IC package assembly 70 houses the power amplification device 10 illustrated in FIG. 1.

Figure 9:
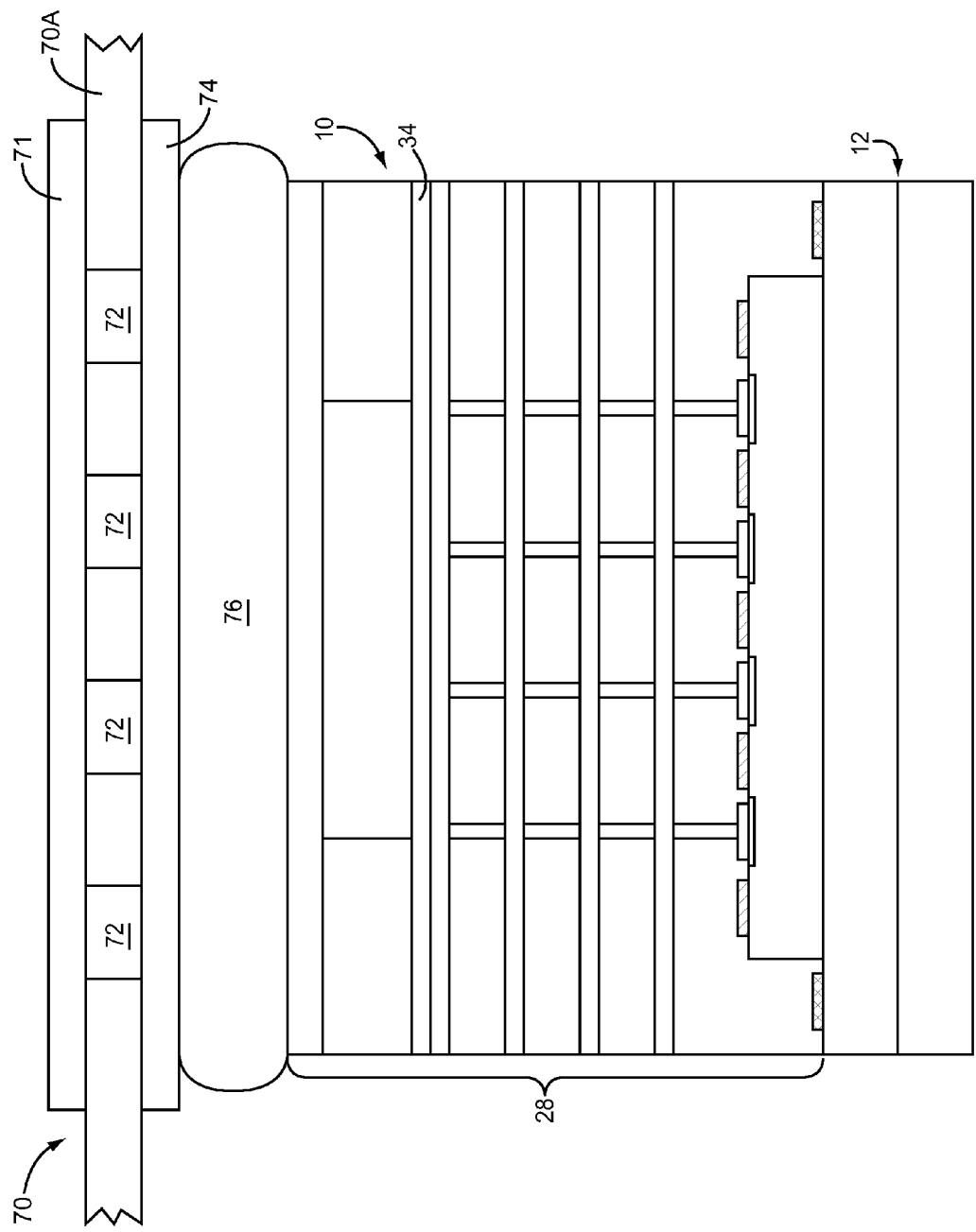
FIG. 9 is an internal view of the IC package assembly illustrated in FIG. 7 where the power amplification device shown in FIG. 1 is connected to ground using a solder bump.

FIG. 9 illustrates one embodiment of the power amplification device 10 connected to a grounding plate 71. The grounding plate 71 is configured to provide a ground for the IC package assembly 70. As shown in FIG. 9, the grounding plate 71 is attached to the IC package 70A. Furthermore, conductive vias 72 are provided through the IC package 70A to connect with an internal ground connection plate 74 so that components housed within the IC package 70A have a manner of connecting to the grounding plate 71. In this embodiment, the power amplification device 10 is housed within the IC package 70A to form the IC package assembly 70. A solder bump 76 couples the power amplification device 10 to the grounding plate 71.

The stack of bipolar transistors is housed by the IC package 70A and the conductive layer 34 is positioned between the stack of bipolar transistors and the grounding plate 71. Since the conductive layer 34 is coupled to the stack of bipolar transistors and has a vertical position relative to the bipolar transistors, heat is allowed to dissipate vertically through the insulating structure 28, through the solder bump 76, and, ultimately, to the grounding plate 71. This provides for a more efficient heat dissipation strategy as compared to horizontally disposed conductive layers. Furthermore, the solder bump 76 is soldered between the conductive layer 34 and the grounding plate 71 such that the conductive layer 34 is grounded by the grounding plate 71. The configuration thus provides better heat dissipation for a flip chip die technology that utilizes solder bumps to couple to ground.

Figure 10:
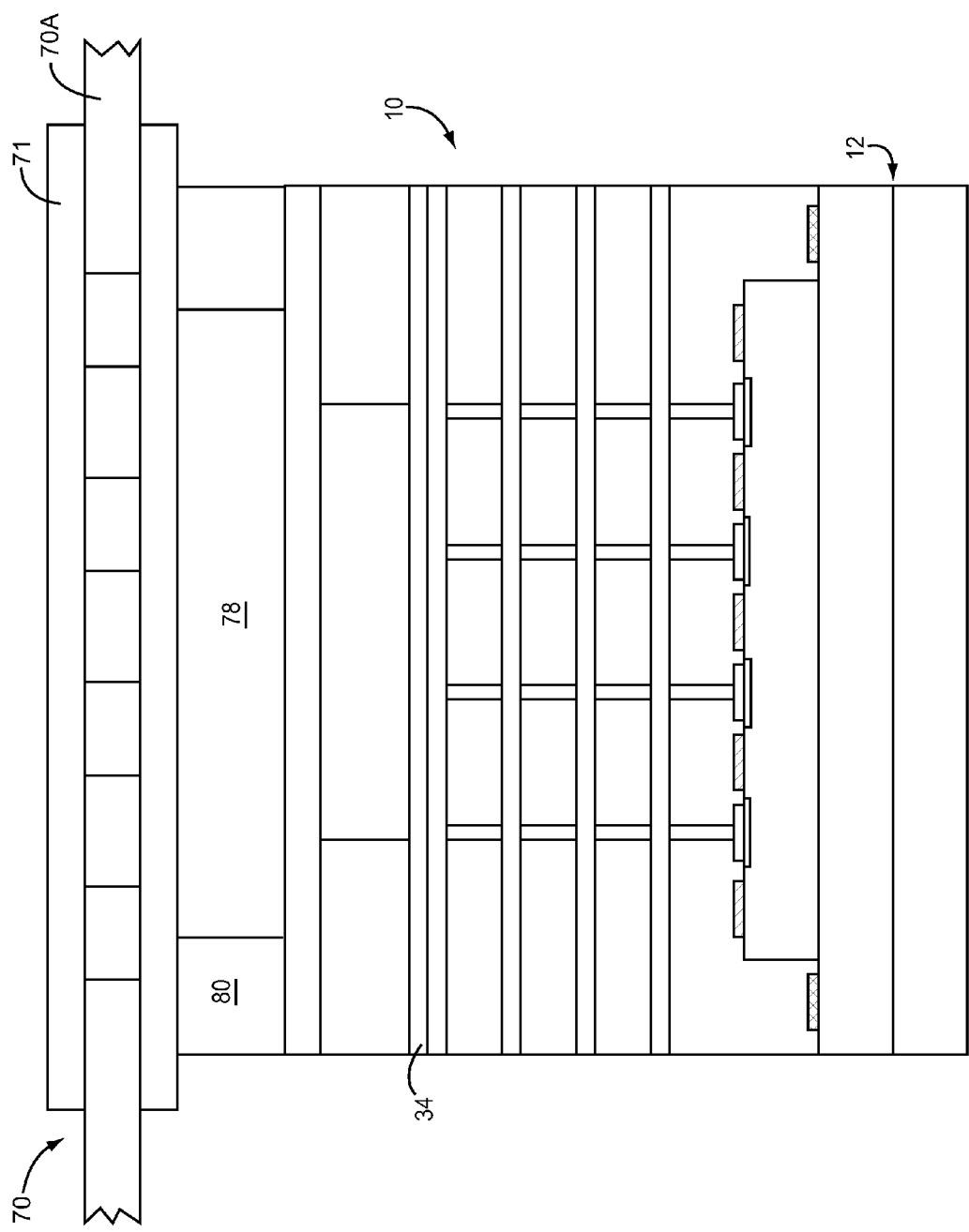
FIG. 10 is an internal view of the IC package assembly illustrated in FIG. 7 where the power amplification device shown in FIG. 1 is connected to ground using a metallic pillar.

FIG. 10 illustrates another embodiment in which the power amplification device 10 is coupled to the grounding plate 71 and attached to the IC package 70A. In this case however, copper pillar technology is utilized to couple to ground. As shown in FIG. 10, the IC package assembly 70 includes a metallic pillar 78 which is generally formed from Copper (Cu). The metallic pillar 78 is formed between the conductive layer 34 and the grounding plate 71 such that the conductive layer 34 is grounded by the grounding plate 71. The metallic pillar 78 may be provided within a dielectric layer 80 in order to electromagnetically isolate the metallic pillar 78. Thus, by using either flip chip technology or Copper pillar technology, the stray inductances that are suffered by wire bonding technology are avoided in order to form a connection to ground.

Figure 11:
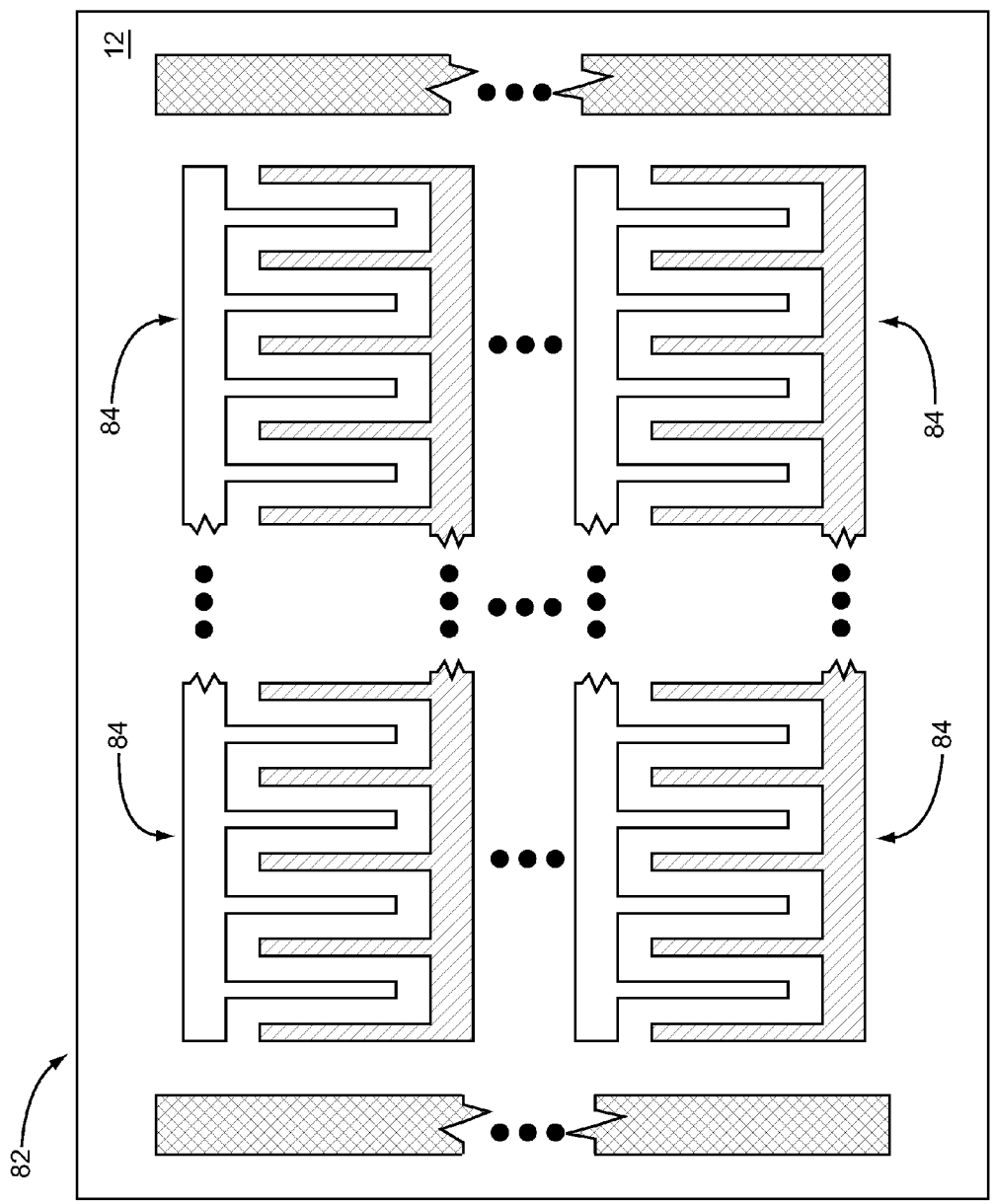
FIG. 11 illustrates an embodiment of a semiconductor substrate that forms a plurality of stacks of bipolar transistors within another embodiment of the power amplification device.

FIG. 11 illustrates another embodiment of a power amplification device 82. This embodiment of the power amplification device has a plurality of transistor cells formed on the semiconductor substrate 12. Each transistor cell 84 includes a stack of bipolar transistors which may be formed in a manner similar to that discussed above. For each stack of bipolar transistors in the transistor cells 84, each of the bipolar transistors is operable to provide amplification to an RF input signal so that an amplified RF output signal is generated by the plurality of stacks of bipolar transistors of the transistor cells 84. Thus, the current of the RF input signal may be divided among the transistor cells 84 and then further divided by the bipolar transistors in the individual transistor cells 84 so that all of the bipolar transistors and all the transistor cells 84 provide amplification to the RF input signal. The power amplification device 82 may be provided within an IC package assembly similar to the IC package assembly 70 discussed above.

Figure 12:
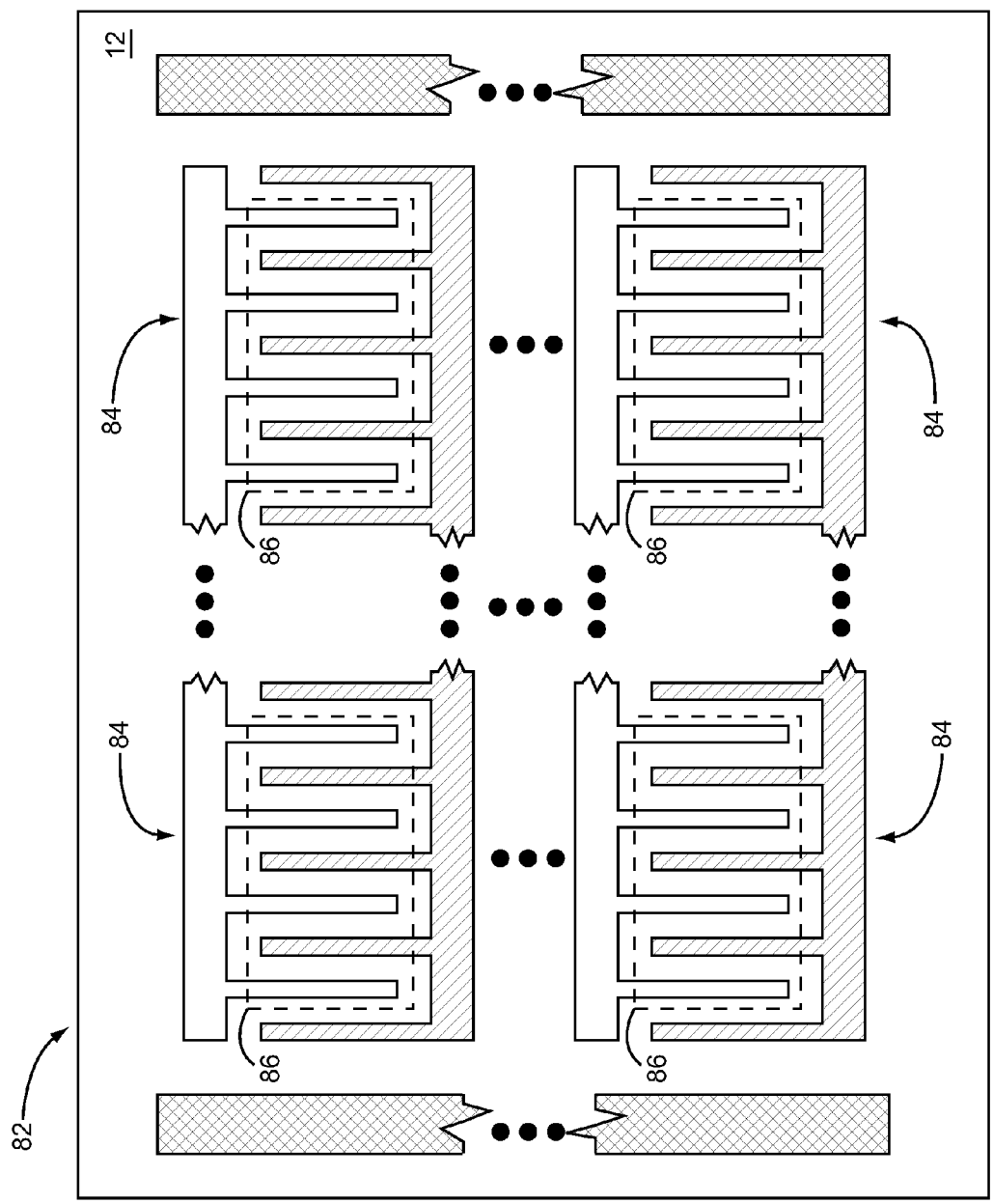
FIG. 12 is the semiconductor substrate shown in FIG. 10 illustrating the position of a plurality of conductive layers relative to each one of the stacks of bipolar transistors.

Thus, as shown by FIG. 12, a conductive layer 86 may be provided for each transistor cell 84. Consequently, the power amplification device 82 includes a plurality of conductive layers 86. Each of the conductive layers 86 may be positioned between the corresponding stack of bipolar transistors in one of the transistor cells 84 and the grounding plate 71 (shown in FIGS. 9 and 10) so that each of the conductive layers 86 can be connected to ground. The resistivity of each of the conductive layers 86 is provided so as to prevent thermal runaway in the stack of bipolar transistors of each transistor cell 84.

Those skilled in the art will recognize improvements and modifications to the preferred embodiments of the present disclosure. All such improvements and modifications are considered within the scope of the concepts disclosed herein and the claims that follow.

What is claimed is:

1. A power amplification device operable to amplify a radio frequency (RF) input signal, comprising:
   a semiconductor substrate comprising a first stack of first bipolar transistors that are formed on the semiconductor substrate, wherein each of the first bipolar transistors is operable to provide amplification to the RF input signal so that an amplified RF current is generated;
   a first conductive layer having an effective resistance that forms at least a portion of a ballast resistor for the first stack of bipolar transistors and being formed over the first stack of the first bipolar transistors; and
   a grounding plate formed over the first conductive layer, wherein the first conductive layer is coupled between the first stack of the first bipolar transistors and the grounding plate such that the amplified RF current flows through the first conductive layer from the first stack of bipolar transistors to the grounding plate in a direction that is orthogonal to a top surface of the first conductive layer and has a resistivity so as to provide the effective resistance of the first conductive layer such that the effective resistance is directly proportional to the thickness of the first conductive layer and prevents thermal runaway in each of the first bipolar transistors.

2. The power amplification device of claim 1 wherein each of the first bipolar transistors is a heterojunction bipolar transistor.

3. The power amplification device of claim 1 wherein each of the first bipolar transistors is a bipolar junction transistor.

4. The power amplification device of claim 1, further comprising:
   an insulating structure formed over the semiconductor substrate so as to insulate the first stack of the first bipolar transistors.

5. The power amplification device of claim 4 wherein the first conductive layer is provided within the insulating structure.

6. The power amplification device of claim 4 wherein the first conductive layer is provided over the insulating structure.

7. The power amplification device of claim 1 wherein the first conductive layer comprises a first metallic layer.

8. The power amplification device of claim 1 wherein:
   the semiconductor substrate further comprises a plurality of stacks of bipolar transistors and the plurality of stacks of bipolar transistors includes the first stack of the first bipolar transistors; and
   for each stack of bipolar transistors in the plurality of stacks of bipolar transistors, each of the bipolar transistors of the stack of bipolar transistors is operable to provide amplification to the RF input signal so that the amplified RF current is generated by the plurality of stacks of bipolar transistors.

9. The power amplification device of claim 8, further comprising:
   a plurality of conductive layers wherein the plurality of conductive layers includes the first conductive layer and wherein each of the plurality of conductive layers is coupled to a different corresponding stack of the plurality of stacks and wherein, for each conductive layer of the plurality of conductive layers, the conductive layer is formed over the corresponding stack of the bipolar transistors and has a corresponding resistivity so as to provide a corresponding effective resistance that prevents thermal runaway in each of the bipolar transistors in the corresponding stack.

10. The power amplification device of claim 1, wherein the effective resistance is approximately 2 Ohms.

11. An integrated circuit (IC) package assembly, comprising:
an IC package;
a grounding plate configured to provide a ground for the IC package assembly;
a semiconductor substrate housed by the IC package, the semiconductor substrate comprising a first stack of first bipolar transistors that are formed on the semiconductor substrate, wherein each of the first bipolar transistors is operable to provide amplification to a radio frequency (RF) input signal so that an amplified RF current is generated; and
a first conductive layer having an effective resistance that forms at least a portion of a ballast resistor for the first stack of bipolar transistors and being positioned between the first stack of the first bipolar transistors and the grounding plate, wherein the first conductive layer is coupled between the first stack of first bipolar transistors and the grounding plate such that the amplified RF current flows through the first conductive layer from the first stack of bipolar transistors to the grounding plate in a direction that is orthogonal to a top surface of the first conductive layer and has a resistivity so as to provide the effective resistance of the conductive layer such that the effective resistance is directly proportional to the thickness of the first conductive layer and prevents thermal runaway in each of the first bipolar transistors.

12. The IC package assembly of claim 11, wherein the grounding plate is attached to the IC package.

13. The IC package assembly of claim 11, further comprising:
a solder bump, wherein the solder bump is soldered between the first conductive layer and the grounding plate such that the first conductive layer is grounded by the grounding plate.

14. The IC package assembly of claim 11, further comprising:
a metallic pillar, wherein the metallic pillar is formed between the first conductive layer and the grounding plate such that the first conductive layer is grounded by the grounding plate.

15. The IC package assembly of claim 11, wherein:
the semiconductor substrate further comprises a plurality of stacks of bipolar transistors and the plurality of stacks of bipolar transistors includes the first stack of the first bipolar transistors; and
for each stack of bipolar transistors in the plurality of stacks of bipolar transistors, each of the bipolar transistors of the stack of bipolar transistors is operable to provide amplification to the RF input signal so that the amplified RF current is generated by the plurality of stacks of bipolar transistors.

16. The IC package assembly of claim 15, further comprising:
a plurality of conductive layers wherein the plurality of conductive layers includes the first conductive layer and wherein each of the plurality of conductive layers is coupled to a different corresponding stack of the plurality of stacks and wherein, for each conductive layer of the plurality of conductive layers, the conductive layer is positioned between the corresponding stack of the bipolar transistors and the grounding plate, and the conductive layer has a corresponding resistivity so as to provide a corresponding effective resistance that prevents thermal runaway in each of the bipolar transistors in the corresponding stack.

17. The IC package assembly of claim 11, wherein the effective resistance is approximately 2 Ohms.

18. A method of forming a power amplification device operable to amplify a radio frequency (RF) input signal, comprising:
providing a semiconductor substrate;
providing a grounding plate;
forming a first stack of first bipolar transistors on the semiconductor substrate, wherein each of the first bipolar transistors is operable to provide amplification to the RF input signal so that an amplified RF current is generated; and
providing a first conductive layer that has an effective resistance that forms at least a portion of a ballast resistor for the first stack of bipolar transistors over the first stack of the first bipolar transistors, wherein the first conductive layer is coupled between the first stack of first bipolar transistors and the grounding plate such that the amplified RF current flows through the first conductive layer from the first stack of bipolar transistors to the grounding plate in a direction that is orthogonal to a top surface of the first conductive layer and has a resistivity so as to provide the effective resistance of the first conductive layer such that the effective resistance is directly proportional to the thickness of the first conductive layer and prevents thermal runaway in each of the first bipolar transistors.

19. The method of claim 18, further comprising:
forming an insulating structure over the semiconductor substrate so as to insulate the first stack of the first bipolar transistors, wherein forming the insulating structure over the semiconductor substrate comprises providing the first conductive layer over the first stack of the first bipolar transistors.

20. The method of claim 18, further comprising:
forming the insulating structure over the semiconductor substrate so as to insulate the first stack of the first bipolar transistors;
wherein providing the first conductive layer over the first stack of the first bipolar transistors comprises providing the first conductive layer over the insulating structure.

21. The method of claim 18 wherein the grounding plate is provided by an integrated circuit (IC) package.

22. The method of claim 21 wherein coupling the first conductive layer to the grounding plate provided by the IC package comprises forming a soldering bump that couples the grounding plate to the IC package.

23. The method of claim 21 wherein coupling the first conductive layer to the grounding plate provided by the IC package comprises forming a metallic pillar that couples the grounding plate to the IC package.

24. The method of claim 18, wherein the effective resistance is approximately 2 Ohms.

* * * * *

UNITED STATES PATENT AND TRADEMARK OFFICE
CERTIFICATE OF CORRECTION

PATENT NO. : 9,911,836 B2
APPLICATION NO. : 13/405481
DATED : March 6, 2018
INVENTOR(S) : Julio Costa and Michael Carroll It is certified that error appears in the above-identified patent and that said Letters Patent is hereby corrected as shown below:

In the Specification

In Column 9, Line 28, replace "resistivity p of the" with --resistivity ρ of the--.

Signed and Sealed this
Twenty-ninth Day of May, 2018

Andrei Iancu
*Director of the United States Patent and Trademark Office*